(12) United States Patent  
Verspecht et al.

(10) Patent No.: US 11,057,256 B1  
(45) Date of Patent: Jul. 6, 2021

(54) MEASUREMENT OF PERIODICALLY MODULATED SIGNALS UNDER NON-COHERENT OPERATING CONDITIONS

(71) Applicant: Keysight Technologies, Inc., Santa Rosa, CA (US)

(72) Inventors: Jan Verspecht, Londerzeel (BE); Troels Studsgaard Nielsen, Aalborg (DK)

(73) Assignee: Keysight Technologies, Inc, Santa Rosa, CA (US)

( * ) Notice: Subject to any disclaimer, the term of this patent is extended or adjusted under 35 U.S.C. 154(b) by 0 days.

(21) Appl. No.: 17/062,726

(22) Filed: Oct. 5, 2020

(51) Int. Cl.
*H04L 5/12* (2006.01)
*H04L 23/02* (2006.01)
*H04L 27/26* (2006.01)
*H04L 27/156* (2006.01)
*H04B 1/58* (2006.01)
*H04B 1/00* (2006.01)

(52) U.S. Cl.
CPC ....... *H04L 27/2659* (2013.01); *H04B 1/0025* (2013.01); *H04B 1/588* (2013.01); *H04L 27/1566* (2013.01)

(58) Field of Classification Search
CPC . H04L 27/2659; H04L 27/1566; H04B 1/588; H04B 1/0025
USPC .......................................................... 375/262
See application file for complete search history.

(56) References Cited

U.S. PATENT DOCUMENTS

| | | |
|---|---|---|
| 10,003,419 B1 | 6/2018 | Verspecht et al. |
| 10,386,444 B1 | 8/2019 | Stickle |
| 10,735,036 B1 | 8/2020 | Verspecht et al. |
| 2010/0201345 A1* | 8/2010 | Gupta .................. H03M 1/1042 324/96 |
| 2017/0115333 A1* | 4/2017 | Radio .................... G01R 23/20 |
| 2019/0219480 A1* | 7/2019 | Jalali ....................... G06K 9/36 |

* cited by examiner

*Primary Examiner* — Tanmay K Shah (57) ABSTRACT

A receiver-implemented method is for measuring a periodically modulated signal. The method includes applying a received periodically modulated signal to a mixer of a receiver, the periodically modulated signal not synchronized with the receiver, and tuning a local oscillator (LO) of the mixer using an estimate of actual carrier frequency and an estimate of an arbitrary waveform generator (AWG) sampling rate to obtain a digitized intermediate frequency (IF) signal. The method further includes applying a short time Fourier transform (STFT) to the digitized IF signal, extracting a carrier frequency offset and a AWG sampling rate offset based on the applied STFT, compensating for the carrier frequency offset, and applying a digital correction to the STFT to compensate for the AWG sampling rate offset. Compensating for the carrier frequency offset may include retuning the LO to obtain a new digitized IF signal to which the digital correction is applied.

14 Claims, 3 Drawing Sheets

MEASUREMENT OF PERIODICALLY MODULATED SIGNALS UNDER NON-COHERENT OPERATING CONDITIONS

BACKGROUND

High-frequency components or systems are often characterized using a stimulus signal that is a periodically modulated radio-frequency (RF) carrier and by measuring and analyzing the response signal. In virtually all applications the response of the device-under-test (DUT) will also be a periodically modulated RF carrier. Because both response and stimulus signals are periodically modulated, they can be represented by a set of complex Fourier series coefficients, also called phasors, that are associated with a discrete set of frequencies. This set of frequencies is represented by a uniform frequency grid centered around the carrier frequency. This grid will be referred to in the following as the frequency grid. The amplitudes and phases of the complex phasors are typically measured by a receiver that is based on a local oscillator, a frequency converting mixer, an analog-to-digital convertor and a digital signal processor.

In case the DUT is an amplifier the frequency grid of the response signal is the same as the frequency grid of the stimulus signal. Consequently, the response signal can be measured by simply synchronizing the receiver with the stimulus signal. The synchronization is typically achieved by using a common 10 MHz reference clock for the receiver and the signal generator. In that case the receiver local oscillator, ADC sample frequency and ADC record length can be set such that the phasors are directly resulting from performing a discrete Fourier transform (DFT) on the ADC record data. The DFT can be used in combination with coherent averaging to significantly increase the signal-to-noise ratio (SNR).

In case the DUT is a mixer a similar technique can be used. In this case the response signal will be frequency shifted relative to the stimulus signal. The amount of frequency shift is determined by the frequency of the local oscillator signal that is applied to the mixer local oscillator input. If both the local oscillator signal sent to the DUT and the stimulus signal itself are synchronized with the receiver, the DUT response signal will also be synchronized with the receiver and one can use a straight DFT to retrieve the phasors.

The above technique is problematic, however, in case the DUT generates a response signal that is not synchronized with the stimulus signal or with the measurement receiver. This happens for example when the DUT is a frequency converter that has an internal local oscillator that is based on its own inaccessible reference clock, like a satellite system. Such a system is referred to as an "embedded LO" system. In that case it is impossible to calculate a priori the exact measurement receiver LO frequencies such that the response IF signal frequencies are aligned with the exact DFT frequencies. Because of the misalignment of IF frequencies and DFT frequencies, applying a DFT on the response signal results in inaccurate values for the phasors and coherent averaging will not result in an improved SNR, but will further distort the phasor values. Another problematic example is the characterization of a transmitter that cannot be synchronized to the receiver. In this case the transmitter will have an offset on both carrier frequency and tone spacing.

SUMMARY

According to an aspect of the inventive concepts, a receiver-implemented method of measuring a periodically modulated signal is provided. The method includes applying a received periodically modulated signal to a mixer of a receiver, the periodically modulated signal not synchronized with the receiver, and tuning a local oscillator (LO) of the mixer using an estimate of an actual carrier frequency and an estimate of an arbitrary waveform generator (AWG) sampling rate to obtain a digitized intermediate frequency (IF) signal. The method further includes applying a short time Fourier transform (STFT) to the digitized IF signal, extracting a carrier frequency offset and a AWG sampling rate offset based on the applied STFT, compensating for the carrier frequency offset, and applying a digital correction to the STFT to compensate for the AWG sampling rate offset.

According to another aspect of the inventive concepts, a vector network analyzer (VNA) is provided that includes a mixer configured to frequency mix a periodically modulated signal and a local oscillator (LO) signal, the periodically modulated signal not synchronized with the VNA, and a processing unit configured to measure the periodically modulated signal applied to the mixer. The processing unit is configured to tune a local oscillator (LO) of the mixer using an estimate of actual carrier frequency and an estimate of an arbitrary waveform generator (AWG) sampling rate to obtain a digitized intermediate frequency (IF) signal, apply a short time Fourier transform (STFT) to the digitized IF signal, extract a carrier frequency offset and a AWG sampling rate offset based on the applied STFT, compensate for the carrier frequency offset, and apply a digital correction to the STFT to compensate for the AWG sampling rate offset.

According to still another aspect of the inventive concepts, a computer readable medium is provided that stores instructions that cause a signal processor of a receiver having a local oscillator (LO) and a mixer to carry out a receiver-implemented method of measuring a periodically modulated signal that is not synchronized with the receiver, where the periodically modulated signal is applied to the mixer of the receiver. The method includes tuning the local oscillator (LO) of the mixer using an estimate of an actual carrier frequency and an estimate of an arbitrary waveform generator (AWG) sampling rate to obtain a digitized intermediate frequency (IF) signal, applying a short time Fourier transform (STFT) to the digitized IF signal, extracting a carrier frequency offset and a AWG sampling rate offset based on the applied STFT, compensating for the carrier frequency offset, and applying a digital correction to the STFT to compensate for the AWG sampling rate offset.

BRIEF DESCRIPTION OF THE DRAWINGS

The above and other aspects and features of the inventive concepts will become readily apparent from the detailed description that follows, with reference to the accompanying drawings, in which.

DETAIL DESCRIPTION

Figure 1:
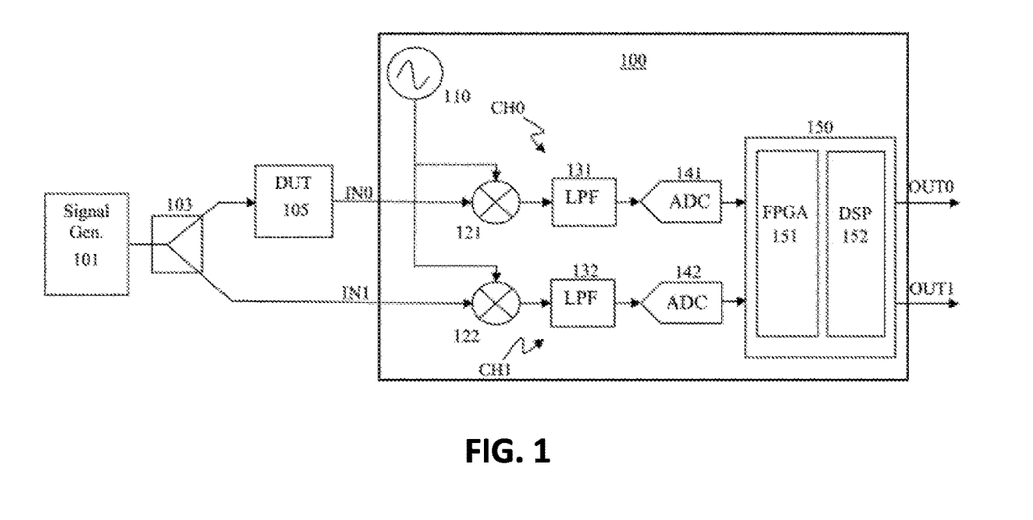
FIG. 1 is a simplified block diagram of a receiver system that may be used to implement embodiments of the inventive concepts.

FIG. 1 is a simplified block diagram of a receiver system for determining LO frequencies of LO signals and for measuring a full spectrum of a periodically modulated RF signal output by a DUT using the determined LO frequencies, according to a representative embodiment. The example of FIG. 1 is described in commonly assigned U.S. Pat. No. 10,003,419, the disclosure of which is incorporated herein by reference in its entirety.

Referring to the example of FIG. 1, the receiver system 100 may a vector network analyzer (VNA) that includes two phase coherent channels CH0 and CH1. It is understood that the embodiments described herein are likewise applicable to single channel systems, as well as to systems have more than two channels, without departing from the scope of the inventive concepts. The channels CH0 and CH1 have corresponding input ports IN0 and IN1 and output ports OUT0 and OUT1, respectively. Generally, the different channels of the receiver system 100 may be used to measure different signals associated with an experiment, such as an input signal to the DUT 105, an output signal of the DUT 105, and/or incident and reflected waves at the input and output ports of the DUT 105. For DUTs having multiple output ports, the corresponding output signals of the DUT may be measured using the different channels, as well.

The receiver system 100 may further include a common sinusoidal local oscillator (LO) 110 that is tunable to provide LO signals having different LO frequencies, the values of which are determined by a digital signal processor (DSP) 152 in a processing unit 150. The receiver system 100 may also include first and second mixers 121 and 122, first and second low pass filters (LPFs) 131 and 132, and first and analog to digital converters (ADCs) 141 and 142, arranged in the first and second channels CH0 and CH1, respectively. As shown, each of the first and second mixers 121 and 122 may receive the same LO signal through an LO port and an input signal (e.g., a portion of the periodically modulated RF signal or "RF input signal") from the corresponding input ports IN0 and IN1, respectively, through an RF port, and output an intermediate frequency (IF) signal through an IF port.

The IF signal is the result of mixing the LO signal and periodically modulated RF signal. In the depicted embodiment, the RF input signal in the first channel CH0 is the periodically modulated RF signal output by the DUT 105 (which may be referred to as the "response signal") in response to the periodically modulated RF signal generated by the signal generator 101 (which may be referred to as the "excitation signal"). The RF input signal in the second channel CH1 is the periodically modulated RF signal itself, generated by the signal generator 101. The signal generator 101 may be an arbitrary waveform generator (AWG), for example. In the depicted embodiment, the receiver system 100 includes a splitter 103 that divides the periodically modulated RF signal generated by the signal generator 101, resulting in the excitation signal input to the DUT 105 (which outputs the RF input signal provided to the first channel CH0, in response) and the RF input signal provided to the second channel CH1, respectively. The DUT 105 is shown as a two-port active device, such as a power amplifier, for example, although other types of DUTs may be incorporated without departing from the scope of the inventive concepts.

In the example of FIG. 1, the processing unit 150 includes a field-programmable gate array (FPGA) and the DSP 152, although various combinations of processing device(s) may be incorporated without departing from the scope of the present teachings. For example, the processing unit 150 may be implemented by a computer processor, FPGAs, application specific integrated circuits (ASICs), or combinations thereof, using software, firmware, hard-wired logic circuits, or combinations thereof. A computer processor, in particular, may be constructed of any combination of hardware, firmware or software architectures, and may include its own memory or memory device (e.g., nonvolatile memory) for storing executable software/firmware executable code that allows it to perform the various functions. In an embodiment, the computer processor may comprise a central processing unit (CPU), for example, executing an operating system. The memory devices constitute non-transient computer-readable mediums. Of course, other types of processors and computing devices, including personal computers, either internal to or external from the receiver system 100, may be incorporated, without departing from the scope of the present teachings.

The processing unit 150 may also include memory for storage of data, applications and other information. The memory may include a variety of non-transient computer-readable mediums suitable for use with the disclosed system, including, for example, solid state storage devices, magnetic storage devices and optical storage devices. For example, memory may be implemented by any number, type and combination of random access memory (RAM) and/or read-only memory (ROM), which may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are non-transitory (e.g., as compared to transitory propagating signals).

The LO frequencies of the LO signals provided by the LO 110 may be initially determined by the DSP 152, such that unwanted images (e.g., harmonics and alias components) generated by mixing the LO signals with the portions of the periodically modulated RF signal by the first and second mixers 121 and 122, respectively, are substantially eliminated. Generally, digitized signal data from the first and second channels CH0 and CH1 are provided to the DSP 152, and converted from the time domain to the frequency domain (e.g., using discrete Fourier transforms (DFTs)) to provide frequency domain records comprising multiple frequency bins (e.g., DFT bins). The LO frequencies of the LO 110 are determined by the DSP 152 such that tones of (subsequently received) periodically modulated RF signals correspond to one set of frequency bins (e.g., first DFT bins), while images caused by mixing the LO signals with the portions of the periodically modulated RF correspond to another set of frequency bins (e.g., second DFT bins). For the received RF input signals, the first DFT bins can be selected and the second DFT bins can be discarded in order to substantially eliminate the images from signal data output by the processing unit 150.

Still referring to FIG. 1, when receiving and mixing the portions of the periodically modulated RF signal with the LO signal, the first mixer 121 outputs an IF signal, which is filtered by the first LPF 131 to filter out high frequency signals, digitized by the first ADC 141 and input to the processing unit 150 for processing the digital signal data. The processing includes selecting frequency bins to which the tones of the periodically modulated RF signals correspond, and discarding frequency bins to which the images correspond, as mentioned above. Likewise, referring to the other coherent channel, the IF signal output by the second mixer 122 is filtered by the second LPF 132, digitized by the second ADC 142 and input to the processing unit 150. The processing unit 150 may also perform spectral stitching of the selected frequency bins for each of the first and second channels CH0 and CH1 resulting from mixing with other LO frequencies. The spectrally stitched signal data from one or more of the first and second output ports OUT0 and OUT1 may be displayed on a display unit (not shown).

The IF outputs are filtered by the first and second LPFs 131 and 132 and digitized by the first and second ADCs 141 and 142 in the receiver system 100. The first and second LPFs 131 and 132 may be low pass anti-alias filters, for example. Each of these low pass anti-alias filters may be a broadband solution, having a cut-off frequency of about 38 MHz, or a narrowband solution, having a cut-off frequency of about 11 MHz, for example. Each of the first and second ADCs 141 and 142 has the same sampling rate for sampling the filtered signal data. In an embodiment, the ADC sampling rate may be about 100 MHz, for example. The filtered and digitized samples are processed by the FPGA 151, as well as by software running on the DSP 152, of the processing unit 150. This results in two digital data outputs (e.g., measuring different parameters) from the first and second output ports OUT0 and OUT1, typically in the frequency domain. The digital data outputs may be further processed by a display processor (not shown) for presentation on a display device (not shown), as mentioned above.

Figure 2:
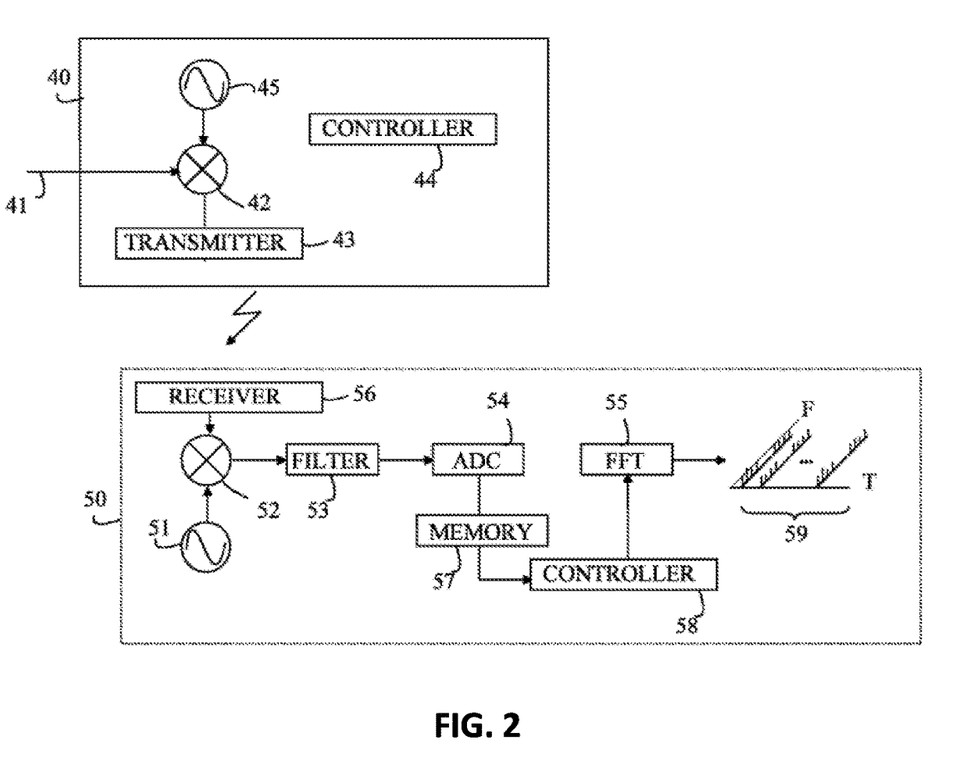
FIG. 2 is a simplified block diagram of a satellite transmitter and a test instrument that analyzes a time domain transmitted signal that may be used to implement embodiments of the inventive concepts.

Now consider a system that generates a signal with a tone spacing and a carrier frequency that are not synchronized with the receiver. It is assumed in the following that the tone spacing and carrier frequency are approximatively known and that the deviations from the ideal synchronized case are relatively small. A practical example could be a satellite in a test chamber, an example of which is represented in FIG. 2. The example of FIG. 2 is taken from commonly assigned U.S. Pat. No. 10,735,036, the disclosure of which is incorporated herein in its entirety.

FIG. 2 illustrates a satellite transmitter 40 and a test instrument 50 that analyzes the time domain transmitted signal. As an example, the test instrument 50 may be a PNA-X Network Analyzer offered by Keysight Technologies Inc. It is assumed that a repetitive time domain signal is input on port 41 of the satellite transmitter 40. This signal is up converted using a LO 45 and a mixture 42, which are under the control of the controller 44. The up converted signal is transmitted by transmitter 43. It is to be understood that satellite transmitter 40 may include many additional tones and may process the up converted signal prior to transmission.

Test instrument 50 may be a vector network analyzer (VNA). Test instrument 50 includes a receiver 56 that receives the RF signal from satellite transmitter 40 and converts that signal to a time domain signal that is applied to a mixer 52 which down converts the signal to an intermediate band determined by LO 51. The output of mixer 52 is typically filtered through a filter 53 which blocks unwanted mixing products. The output of filter 53 is digitized by ADC 54. The digitized output is stored in memory 57. The number of samples digitized is sufficient to provide the input for a number of different frequency spectra starting at different times during the ADC record using a fast Fourier transform (FFT) 55. Each FFT spectrum is characterized by a time index of the first sample that is included in the time domain record that is transformed. Each spectrum comprises a plurality of phasors, each phasor providing an amplitude and phase of a corresponding tone. A controller 58 construct the sequence of spectra shown at 59.

Assume the frequency of LO 51 is slightly different from that of LO 45. In principle, the frequency offset can be determined by examining the phases of the tones in the FFT spectra as a function of the time index associated with each FFT spectrum. Since each FFT spectrum is computed from a single continuous ADC record, the phase of a tone corresponding to one of the tones in the input signal to test instrument 50 will vary linearly with the time index, the slope of that line being proportional to the frequency offset.

Figure 3:
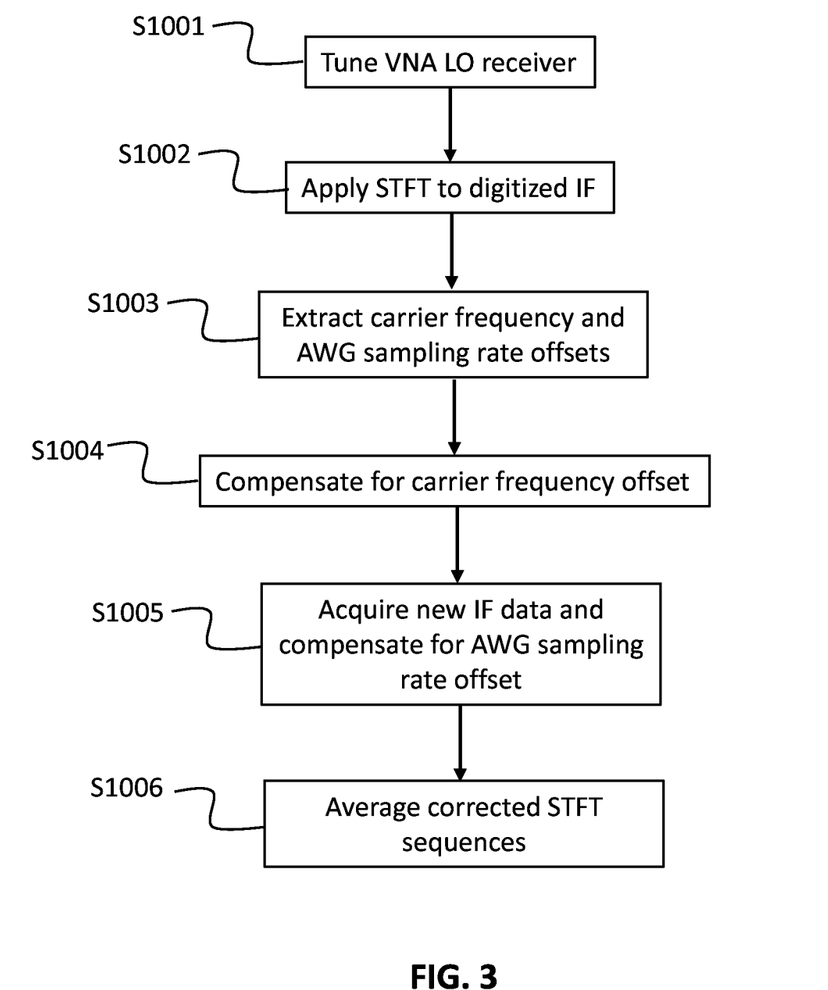
FIG. 3 is a flowchart for reference in explaining a method of measuring periodically modulated signals according to embodiments of the inventive concepts.

Attention is now directed to FIG. 3 which is a flowchart summarizing a method of using a vector network analyzer (VNA), for example, to measure unsynchronized modulated signals. This method enables the VNA to measure the amplitude and phase of the Fourier series coefficients of periodically modulated input and output signals without the need of synchronization between the AWG sampling clock and the VNA receiver.

Referring to FIG. 3, initially the VNA LO receiver is tuned to the periodically modulated signals using an estimate of the actual carrier frequency and AWG sampling rate. (S1001) The result is a digitized IF signal. Then, a short time Fourier transform (STFT) is applied to the digitized IF signal. (S1002) Based on the STFT, the carrier frequency offset from ideal and the AWG sampling rate offset from ideal are extracted. (S1003) Next compensation is made for the carrier frequency offset. This may be accomplished by retuning the VNA LO receiver to match the exact carrier frequency offset. (S1004) New IF data is then acquired and a digital correction is applied to the STFT to compensate for the known AWG sampling rate offset. (S1005) Then, after the STFT sequences have been corrected, they are averaged to obtain a coherently averaged estimate for the phase and amplitude of the Fourier series coefficients representing the periodically modulated input and output signals. (S1006)

The method summarized above will now be described in greater detail.

The method includes initially estimating the previously described unknown small offsets of the carrier frequency and the tone spacing and adjusting the receiver LO frequency such that it is tuned into the corrected carrier frequency. The unknown frequency offsets may be determined by sampling the IF signal and creating a large ADC data record. Next one determines the minimal DFT record size, denoted R herein, that is needed to separate the different phasors present in the IF signal. It is noted here that the phasors present in the IF signal may include direct mixing products between the RF phasors and the receiver LO signal as well as image mixing products and harmonic mixing products. Next one calculates a short time Fourier transform (STFT) associated with the ADC data record. The STFT is a 2-dimensional complex matrix with a frequency dimension and a time dimension. The STFT is sometimes referred to as a time-dependent spectrum. The time dimension refers to the start time, within the long data record, that is used to calculate the corresponding DFT with length R, and the frequency dimension refers to the DFT frequencies. Although the resolution of the time dimension can theoretically be as small as one sampling period, one will typically use a higher value to speed up the calculations. In practice a value equal to R/2 or even R is common. Note that a time resolution smaller than R will result in correlation between the time dependent DFTs. A tapering windowing technique can be used for calculating each DFT. This will limit so-called cross-frequency leakage whereby information from one phasor influences the value of another phasor.

Next one calculates the time domain cross-correlation waveform corresponding to each consecutive DFT within the STFT and the first DFT. The process of calculating the cross-correlation eliminates additive noise and results in a set of measurements with a good signal-to-noise-ratio (SNR). The result of the time domain cross-correlation is a pulse like time domain signal associated with each consecutive DFT. This pulse, which we will call the correlation pulse, is characterized for each DFT by a complex amplitude and a location, in time domain, where it reaches maximum amplitude. The unknown carrier frequency offset between the uniform grid of IF phasors and the DFT grid will cause the phase of the correlation pulse to be a linear function of the starting time associated with the DFT, whereby the slope is proportional to the unknown frequency offset. The unknown offset in the tone spacing will cause the time location at which the correlation pulse reaches its maximum, to be a linear function of the starting time of the DFT.

In a final step the unknown frequency offsets are estimated by performing linear phase curve fits on the correlation pulses: the slope of the phase of the correlation pulse reveals the carrier frequency offset and the slope of the location of the maximum of the correlation pulse reveals the sampling frequency offset.

Described next are examples of the relationships used to calculate the cross-correlation pulses by means of the STFT algorithm. The RF signal may be expressed as a repetitively modulated carrier signal with a carrier frequency that is not exactly known. The time domain signal $s_{RF}(t)$ is expressed as a function of its phasors $X[k]$ by $$s_{RF}(t) = Re\left(\sum_{k=-K}^{K} X[k]\exp(j2\pi k(f_M + f_E)t)\exp(j2\pi(f_{RF} + f_U)t)\right). \quad \text{(Eq. 1)}$$

The RF phasor with index k is represented by $X[k]$, the tone spacing is represented by $f_M+f_E$, with $f_E$ representing the unknown small frequency offset from the ideal tone spacing, and the carrier frequency is represented by $f_{RF}+f_U$, with $f_U$ representing the unknown small frequency offset from the ideal carrier frequency $f_{RF}$. To simplify the mathematical equations, we will consider in the following that we only need to consider the analytical form of the signal. The analytical form is represented by $x_{RF}(t)$ and is given by $$x_{RF}(t) = \sum_{k=-K}^{K} X[k]\exp(j2\pi k(f_M + f_E)t)\exp(j2\pi(f_{RF} + f_U)t). \quad \text{(Eq. 2)}$$

The analytical form can be used under the assumption that there is no interference, at the DFT level, of the negative and positive frequencies. This is achieved in practice by making sure that the DFT frequencies that are used are far enough from DC as well as the Nyquist frequency, sometimes in combination with a tapering window function.

The measurement receiver performs a frequency conversion by mixing the RF signal with an LO signal, digitizing the resulting IF signal and performing the STFT.

Because the detection will rely on the use of a DFT, it is important that $f_M$ is compatible with the frequency grid of the DFT. As such $$f_M = Mf_0 = M\frac{f_S}{R}, \quad \text{(Eq. 3)}$$

with M an integer, $f_0$ equal to the DFT frequency resolution, $f_S$ equal to the ADC sampling rate and R equal to the DFT record size.

The LO frequency $f_{LO}$ and DFT record size R are chosen such that the down-converted phasors, under the assumption of $f_U=0$ and $f_E=0$ end up on exact DFT frequencies. This is achieved by choosing $$f_{LO}=f_{RF}-Kf_M-Df_0, \quad \text{(Eq. 4)}$$

with D an integer.

After frequency conversion, the analytic time domain IF signal $x_{IF}(t)$ is an approximately repetitive signal containing tones on a close to uniform frequency grid, offset from a zero frequency, and is expressed as follows.

$$x_{IF}(t) = \exp(-j\theta_{LO}) \quad \text{(Eq. 5)}$$
$$\sum_{k=0}^{2K} X[k-K]\exp(j2\pi(D+kM)f_0 t)\exp(j2\pi(f_U + kf_E)t),$$

with $\theta_{LO}$ representing the phase of the receiver local oscillator signal. The phase shift introduced by the local oscillator signal is unknown but will be common for all phasors. In the following we will represent this phase shift $ex(-j\theta_{LO})$ by the constant Ø.

The sampled IF signal, sampled at the rate $f_S$, is given by the complex time series $x_{IF}[n]$, with $$x_{IF}[n] = x_{IF}\left(\frac{n}{f_S}\right) = \quad \text{(Eq. 6)}$$
$$\emptyset\sum_{k=0}^{2K} X[k-K]\exp\left(j2\pi(D+kM)f_0\frac{n}{f_S}\right)\exp\left(j2\pi(f_U + kf_E)\frac{n}{f_S}\right).$$

According to (Eq. 3) $f_S=Rf_0$, which when substituted into (Eq. 6) results in $$x_{IF}[n] = \emptyset\sum_{k=0}^{2K} X[k-K]\exp\left(j2\pi(D+kM)\frac{n}{R}\right)\exp\left(j2\pi(\varepsilon + k\alpha)\frac{n}{R}\right), \quad \text{(Eq. 7)}$$

with $$\varepsilon = \frac{f_U}{f_S}$$

representing the unknown offset of the carrier frequency, divided by the ADC sampling frequency, and with $$\alpha = \frac{f_E}{f_S}$$

representing the unknown offset of the tone spacing, divided by the ADC sampling frequency.

Next one calculates the STFT for time index d and for frequency index D+lM (that is a frequency index corresponding to one of the phasors in case the unknown frequency offsets would be equal to zero). Note that the expression corresponds to the DFT expression of the time translated version of $x_{IF}[n]$.

$$STFT[d, D+lM] = \phi \frac{1}{R}\sum_{i=0}^{R-1} x_{IF}[i+d]\exp\left(-j2\pi\frac{D+lM}{R}i\right). \quad \text{(Eq. 8)}$$

$$STFT[d, D+lM] = \phi\frac{1}{R}\sum_{i=0}^{R-1}\sum_{k=0}^{2K} X[k-K]\exp\left(j2\pi(D+kM)\frac{i+d}{R}\right) \quad \text{(Eq. 9)}$$
$$\exp\left(j2\pi(\varepsilon+k\alpha)\frac{i+d}{R}\right)\exp\left(-j2\pi\frac{D+lM}{R}i\right).$$

Changing the order of the summation results in $$STFT[d, D+lM] = \phi\exp\left(j2\pi\varepsilon\frac{d}{R}\right) \quad \text{(Eq. 10)}$$
$$\sum_{k=0}^{2K}\left(X[k-K]\exp\left(j2\pi k\alpha\frac{d}{R}\right)\exp\left(j2\pi(D+kM)\frac{d}{R}\right)\right.$$
$$\left.\sum_{i=0}^{R-1}\frac{1}{R}\exp\left(j2\pi\frac{(k-l)M}{R}i\right)\exp\left(j2\pi(\varepsilon+k\alpha)\frac{i}{R}\right)\right).$$

The above expression can be simplified by noting that $$\sum_{i=0}^{R-1}\frac{1}{R}\exp\left(j2\pi\frac{(k-l)M}{R}i\right)\exp\left(j2\pi(\varepsilon+k\alpha)\frac{i}{R}\right) \approx \quad \text{(Eq. 11)}$$
$$\delta_{kl}\sum_{i=0}^{R-1}\frac{1}{R}\exp\left(j2\pi(\varepsilon+k\alpha)\frac{i}{R}\right),$$

with δkl the Kronecker symbol. Substitution of (Eq. 11) in (Eq. 10) results in $$STFT[d, D+lM] \approx \phi X[l-K]\exp\left(j2\pi(\varepsilon+l\alpha)\frac{d}{R}\right) \quad \text{(Eq. 12)}$$
$$\exp\left(j2\pi(D+lM)\frac{d}{R}\right)\sum_{i=0}^{R-1}\frac{1}{R}\exp\left(j2\pi(\varepsilon+l\alpha)\frac{i}{R}\right).$$

The problem at hand can then be formulated as follows. Given STF[d,D+lM], calculate an estimate for both ε and α. This is done as follows. One starts by calculating a two-dimensional time domain cross-correlation function C(n,k) as follows.

$$C[n,k]=\text{IDFT}(\text{conj}(STFT[0,D+lM])STFT[nR,D+lM]), \quad \text{(Eq. 13)}$$

with "IDFT" representing the inverse discrete Fourier transform versus discrete frequency indices "1", and with continuous variable "k" representing the corresponding fast time. C[n,k] can be interpreted as a two-dimensional time domain correlation function, with a discrete slow time index "d" and a continuous fast time variable "k". In practice the IDFT with a continuous variable "k" can be calculated by using an inverse fast Fourier transform algorithm with zero appending. Substitution of (Eq. 12) into (Eq. 13) results in $$C[n,k] = \quad \text{(Eq. 14)}$$
$$IDFT\left(|X[l-K]|^2\exp(j2\pi(\varepsilon+\alpha l)n)\left|\sum_{i=0}^{R-1}\frac{1}{R}\exp\left(j2\pi(\varepsilon+\alpha l)\frac{i}{R}\right)\right|^2\right).$$

Using the definition of the IDFT we find that $$C[n,k] = \sum_{l=1}^{L}|X[l-K]|^2\left|\sum_{i=0}^{R-1}\frac{1}{R}\exp\left(j2\pi(\varepsilon+\alpha l)\frac{i}{R}\right)\right|^2 \quad \text{(Eq. 15)}$$
$$\exp(j2\pi(\varepsilon+\alpha l)n)\exp\left(-j2\pi l k\frac{1}{L}\right),$$

from which follows $$C[n,k] = \exp(j2\pi\varepsilon n)\sum_{l=1}^{L}|X[l-K]|^2 \quad \text{(Eq. 16)}$$
$$\left|\sum_{i=0}^{R-1}\frac{1}{R}\exp\left(j2\pi(\varepsilon+\alpha l)\frac{i}{R}\right)\right|^2 \exp\left(j2\pi l\left(\alpha n - k\frac{1}{L}\right)\right).$$

The above expression reveals that [n,k] has a factor exp(j2πε n) that is independent from "k", followed by a summation of scalars multiplied by a rotating phasor $$\exp\left(j2\pi l\left(\alpha n - k\frac{1}{L}\right)\right).$$

The amplitude of the sum will be maximum for that value for "k", noted $k_{MAX}$ (n), which makes the rotation equal to zero. This condition is met if $$\alpha n - k_{MAX}(n)\frac{1}{L} = 0, \text{ or} \quad \text{(Eq. 17)}$$

$$k_{MAX}(n) = \alpha n L. \quad \text{(Eq. 18)}$$

We see that $k_{MAX}$(n), the maximum position of the correlation function C[n,k] for a given slow time index "n" is a linear function of "n" with a slope equal to αL. In practice one often uses an IFFT with zero appending, resulting in a discrete value for $k_{MAX}$(n). Approximation of |C[n, k]|² by a parabolic shape around the discrete $k_{MAX}$(n) results in a refined estimate for kMAX(n) that is no longer tied to the IFFT grid. The phase of C [n, $k_{MAX}$(n)] is given by $$\varphi(C[n,k_{MAX}(n)])=\varphi(\exp(j27\pi\varepsilon n))=2\pi\varepsilon n. \quad \text{(Eq. 19)}$$

(Eq. 18) and (Eq. 19) provide an accurate way to estimate both α and ε in an orthogonal way.

An estimator for α, noted $\hat{\alpha}$, is found by finding the slope of $k_{MAX}$(n) versus n and dividing it by L.

An estimator for ε, noted $\hat{\varepsilon}$, is found by finding the slope of C [n, $k_{MAX}$(n)] versus n and dividing it by 2π.

In many cases the goal is to have an accurate measurement of the phasors X[l–K]. This is done as follows. As a first step $\hat{\varepsilon}$ is used to tune the receiver local oscillator frequency. By adjusting $f_{LO}$, usually in an iterative way, ε can be made equal to zero. A similar tuning for $f_S$ with the goal of also making α equal to zero is often not available as $f_S$ is usually fixed in network analyzers. In that case the data is corrected by using the knowledge of $\hat{\alpha}$ and applying a phase compensation before averaging to estimate the value of X[l-K]. This may be done as follows. The estimator for X[l-K], noted as $X[\widehat{l-K}]$, is given by $$X[\widehat{l-K}] = \frac{1}{N}\sum_{n=1}^{N} STFT[nR, D + lM]\exp(-j2\pi\hat{\alpha}ln). \quad \text{(Eq. 20)}$$

The averaging of the phase adjusted STFT will significantly reduce any additive noise. In the limit of an infinite amount of averages $X[\widehat{l-K}]$ tends to the value given below.

$$\lim_{N\to\infty} X[\widehat{l-K}] = \phi X[l-K]\sum_{i=0}^{R-1}\frac{1}{R}\exp\left(j2\pi\frac{\alpha li}{R}\right). \quad \text{(Eq. 21)}$$

As mentioned before the expression $$\sum_{i=0}^{R-1}\frac{1}{R}\exp\left(j2\pi\frac{\alpha li}{R}\right)$$

will be close to 1 and can be neglected in many practical cases. If deemed necessary, this factor can be calculated and compensated for as well by making use of $\hat{\alpha}$:

A tapering window, as explained in a prior paragraph, can be used to eliminate the effect of interference.

The inventive concepts also encompass a computer readable medium that stores instructions that cause a data processing system (such as the DSP of an NVA) to execute the methods described herein. A computer readable medium is defined to be any medium that constitutes patentable subject matter under 35 U.S.C. § 101 and excludes any medium that does not constitute patentable subject matter under 35 U.S.C. § 101. Examples of such media include non-transitory media such as computer memory devices that store information in a format that is readable by a computer or data processing system. More specific examples of non-transitory media include computer disks and non-volatile memories.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. While representative embodiments are disclosed herein, one of ordinary skill in the art appreciates that many variations that are in accordance with the present teachings are possible and remain within the scope of the appended claim set. The invention therefore is not to be restricted except within the scope of the appended claims,

What is claimed is:

1. A receiver-implemented method of measuring a periodically modulated signal, said method comprising:
  applying a received periodically modulated signal to a mixer of a receiver, the periodically modulated signal not synchronized with the receiver, and tuning a local oscillator (LO) of the mixer using an estimate of an actual carrier frequency and an estimate of an arbitrary waveform generator (AWG) sampling rate to obtain a digitized intermediate frequency (IF) signal;
  applying a short time Fourier transform (STFT) to the digitized IF signal;
  extracting a carrier frequency offset and an AWG sampling rate offset based on the applied STFT;
  compensating for the carrier frequency offset and applying a digital correction to the STFT to compensate for the AWG sampling rate offset.

2. The method of claim 1, wherein compensation for the carrier frequency offset includes retuning the LO to obtain a new digitized IF signal to which the digital correction is applied.

3. The method of claim 1, wherein the receiver is a vector network analyzer (VNA).

4. The method of claim 1, further comprising averaging corrected STFT sequences to obtain a coherently averaged estimate for the phase and amplitude of Fourier series coefficients representing the periodically modulated signal.

5. The method of claim 1, wherein the applying the STFT, the extracting and the compensating are carried out by a digital signal processor (DSP) of the receiver.

6. A vector network analyzer (VNA), comprising:
  a mixer configured to frequency mix a periodically modulated signal and a local oscillator (LO) signal, the periodically modulated signal not synchronized with the VNA; and
  a processing unit configured to measure the periodically modulated signal applied to the mixer;
  wherein the processing unit is configured to tune a local oscillator (LO) of the mixer using an estimate of actual carrier frequency and an estimate of an arbitrary waveform generator (AWG) sampling rate to obtain a digitized intermediate frequency (IF) signal, apply a short time Fourier transform (STFT) to the digitized IF signal, extract a carrier frequency offset and a AWG sampling rate offset based on the applied STFT, compensate for the carrier frequency offset, and apply a digital correction to the STFT to compensate for the AWG sampling rate offset.

7. The VNA of claim 6, wherein the processing unit includes a digital signal processor (DSP).

8. The VNA of claim 7, wherein the processing unit further includes a field-programmable gate array (FPGA).

9. The VNA of claim 7, wherein the DSP is configured to compensate for the carrier offset frequency by retuning the LO to obtain a new digitized IF signal.

10. The VNA of claim 6, wherein the processing unit is further configured to average corrected STFT sequences to obtain a coherently averaged estimate for the phase and amplitude of Fourier series coefficients representing the periodically modulated signal.

11. A computer readable medium that stores instructions that cause a signal processor of a receiver having a local oscillator (LO) and a mixer to carry out a receiver-implemented method of measuring a periodically modulated signal that is not synchronized with the receiver, wherein the periodically modulated signal is applied to the mixer of the receiver, and the method comprising:
  tuning the local oscillator (LO) of the mixer using an estimate of an actual carrier frequency and an estimate of an arbitrary waveform generator (AWG) sampling rate to obtain a digitized intermediate frequency (IF) signal;
  applying a short time Fourier transform (STFT) to the digitized IF signal;

extracting a carrier frequency offset and a AWG sampling rate offset based on the applied STFT;

compensating for the carrier frequency offset; and applying a digital correction to the STFT to compensate for the AWG sampling rate offset.

12. The computer readable medium of claim 11, wherein compensation for the carrier frequency offset includes retuning the LO to obtain a new digitized IF signal to which the digital correction is applied.

13. The computer readable medium of claim 11, wherein the receiver is a vector network analyzer (VNA).

14. The computer readable medium of claim 8, further comprising averaging corrected STFT sequences to obtain a coherently averaged estimate for the phase and amplitude of Fourier series coefficients representing the periodically modulated signal.

* * * * *